United States Patent
Lenz

(10) Patent No.: US 7,468,607 B2
(45) Date of Patent: Dec. 23, 2008

(54) ELECTRIC AMPLIFIER AND METHOD FOR THE CONTROL THEREOF

(75) Inventor: Helmut Lenz, Oberasbach (DE)

(73) Assignee: Siemens Aktiengesellschaft, Munich (DE)

( * ) Notice: Subject to any disclaimer, the term of this patent is extended or adjusted under 35 U.S.C. 154(b) by 36 days.

(21) Appl. No.: 11/629,442

(22) PCT Filed: Jun. 14, 2005

(86) PCT No.: PCT/EP2005/052753

§ 371 (c)(1), (2), (4) Date: Dec. 13, 2006

(87) PCT Pub. No.: WO2005/124382

PCT Pub. Date: Dec. 29, 2005

(65) Prior Publication Data

US 2008/0012636 A1    Jan. 17, 2008

(30) Foreign Application Priority Data

Jun. 18, 2004   (DE) .................. 10 2004 029 413

(51) Int. Cl.
*G01V 3/00*   (2006.01)
(52) U.S. Cl. ...................... 324/322; 324/318
(58) Field of Classification Search ......... 324/300–322; 600/410; 318/811, 731, 717, 324, 227; 330/10, 330/96; 341/118, 120; 327/423, 110
See application file for complete search history.

(56) References Cited

U.S. PATENT DOCUMENTS

| 4,560,914 | A | * | 12/1985 | Lafonta et al. ................. 330/7 |
| 5,237,277 | A | | 8/1993 | Lenz |
| 5,721,490 | A | * | 2/1998 | Takano et al. ............... 324/322 |
| 6,025,720 | A | | 2/2000 | Lenz et al. |
| 6,031,422 | A | * | 2/2000 | Ideler .......................... 330/10 |
| 6,400,158 | B1 | | 6/2002 | Van Groningen et al. |
| 6,448,775 | B1 | * | 9/2002 | Lenz .......................... 324/322 |
| 6,459,265 | B1 | * | 10/2002 | Lou et al. .................... 324/322 |
| 6,646,439 | B1 | | 11/2003 | Bunk |

FOREIGN PATENT DOCUMENTS

| DE | 197 06 756 C2 | 8/2001 |
| EP | 0 780 950 A2 | 6/1997 |
| WO | WO 91/19993 A | 12/1991 |

* cited by examiner

*Primary Examiner*—Brij B Shrivastav
(74) *Attorney, Agent, or Firm*—Brinks, Hofer, Gilson & Lione

(57) ABSTRACT

A method for controlling an electric amplifier is provided. The method includes monitoring a closed-loop control signal of a regulator, which triggers an end stage of the amplifier; adjusting the closed-loop control signal as a function of an output signal of the end stage; comparing the closed-loop control signal with a reference signal; triggering the end stage when an amplitude limit value and a period length limit value are exceeded or undershot by the amplitude value and period length value, respectively, of the closed-loop control signal; and blocking an input side and/or the regulator when the end stage is triggered.

19 Claims, 7 Drawing Sheets

ELECTRIC AMPLIFIER AND METHOD FOR THE CONTROL THEREOF

The present patent document is a continuation of PCT Application Serial Number PCT/EP2005/052753, filed Jun. 14, 2005 designating the United States and DE 10 2004 029 413.5, filed Jun. 18, 2004, both of which are hereby incorporated by reference.

BACKGROUND

The present embodiments relate to an electric amplifier and method for the control thereof.

An electric amplifier is often constructed using two stages. In a first stage, an intermediate circuit generator or a power pack generates a supply voltage of average precision. The power pack supplies an end stage, which generates an output signal with the desired property. The output signal, depending on various requirements, may have a voltage that is converted upward compared to the supply voltage. The output signal, depending on the use, may have predeterminable signal courses that are either constant or that vary over time.

An electric amplifier may be used as a gradient amplifier for gradient coils, for example, in magnetic resonance systems. For example, quickly changing courses of output signals over time should be adhered to precisely. Switch elements, which are provided in the end stage of a bridge circuit, may be triggered in such a way that when the required supply voltage is supplied, the output signal with the desired properties can be generated.

The precision with which the desired parameter values of the output signal can be adhered to depends on the properties of a trigger device that triggers the end stage switch elements of the electric amplifier.

The trigger device includes a control unit that triggers the switch elements, and a regulator. The switch elements may be, for example, semiconductor components. The regulator, which is connected upstream of the control unit, makes a closed-loop control signal available to the control unit as a function of the output signal output by the end stage. The regulator, the control unit, and the end stage forma closed-loop control circuit. The regulator compares a desired-value parameter with a regulating or actual-value variable measured using the output signal of the end stage. The regulator, as a function of a standard deviation, outputs a controlled-value variable. Standard deviation is understood to be the difference between the desired-value parameter and the actual-value variable. When the actual-value variable is increasing, the standard deviation assumes a negative value. The regulator reduces the controlled-value variable to an increased extent. The decrease in the controlled-value variable counteracts the increase in the actual-value variable. This is known as negative feedback.

If an incorrect setting of the regulator causes the negative feedback to change into a positive feedback, then the closed-loop control circuit of a regulator amplification, for example, becomes unstable and begins to oscillate. The term positive feedback is when the controlled-value variable, which corresponds to the closed-loop control signal output by the regulator, also rises with an increasing actual-value variable. A positive feedback may be caused by the regulator. The positive feedback may be caused by, for example, overly high regulator amplification and is expressed in a constantly rising amplitude and frequency of the closed-loop control signal, which causes the regulator to overamplify. Because of the closed-loop control signal that oscillates in positive feedback of the regulator, components in the control unit may become damaged or overloaded because of the wide amplitude at the elevated frequency.

SUMMARY

A method improves stabilization of a closed-loop control circuit in an electric amplifier.

In one embodiment, the electric amplifier includes an end stage, which is connected on the input side to a control unit, which in turn is preceded by a regulator. A monitoring device is provided on the output side of the regulator. The monitoring device monitors a closed-loop control signal made available by the regulator.

In one embodiment, the method includes the monitoring of the closed-loop control signal, adjusted as a function of an output signal of the end stage, by a comparison with a reference signal. The end stage is triggered to operate as a block on the input side, or on the input and output sides, if an amplitude value and a period length value of the closed-loop control signal exceed or undershoot the respective amplitude limit value and period length limit value. The "amplitude value" is a parameter value of the closed-loop control signal that is dependent on the amplitude. "Period length value" is a parameter value, which is dependent on the closed-loop control signal over time, for example, a period length or frequency. In one embodiment, the regulator or the closed-loop control circuit may also be blocked, for example, alternatively or in addition to the intervention into the triggering of the end stage. "Blocking" is substantially a deactivation, or setting to zero.

In one embodiment, the method for oscillation monitoring and the monitoring device may be used for both analog and digital regulators.

In one embodiment, whether the closed-loop control circuit oscillates depends on an oscillation condition, which includes an amplitude condition and a phase condition. In this embodiment, for example, if the oscillation condition is met, then the closed-loop control signal, which is caused by an instability of the regulator, is monitored in amplitude and frequency by the monitoring device. If the closed-loop control signal is oscillating, then positive feedback is occurring, instead of negative feedback, with increasing frequency and increasing amplitude.

In one embodiment, the monitoring device protects components of the control unit against damage from overly high amplitudes and overly high frequency of the closed-loop control signal. In one embodiment, when an oscillating closed-loop control signal occurs, the monitoring device makes a monitoring signal available to the control unit that triggers switch elements provided in the end stage. In one embodiment, when the closed-loop control signal oscillates, the monitoring device takes on the triggering of the control unit and triggers the switch elements in the end stage so that they are blocking. The control unit triggers the switch elements in the end stage in such a way that the end stage is blocked on only its input side, so as to prevent an abruptly dropping edge of the current amplitude of an output signal of the end stage.

In one embodiment, the monitoring device includes a comparator circuit that monitors the amplitude of the closed-loop control signal. The comparator circuit compares the course of the closed-loop control signal voltage with an upper and a lower reference voltage. The comparator circuit includes a first and a second limit-value comparator. In one embodiment, the closed-loop control signal is supplied to both limit-value comparators simultaneously. The first limit-value comparator compares the amplitude of the closed-loop control signal with an upper amplitude limit value. The first limit-value also modifies the value of its output signal as soon as the amplitude of the closed-loop control signal rises above the upper amplitude limit value. In contrast to the first limit-value comparator, the second limit-value comparator compares the amplitude of the closed-loop control signal with a lower amplitude limit value. The second limit-value comparator modifies the value of its output signal if the amplitude of the closed-loop control signal drops below the lower amplitude limit value.

In one embodiment, the monitoring device expediently includes a flip-flop with a set input and a reset input. In this embodiments the output signals of the first and second limit-value comparators may be joined together. For example, the output signal of the first limit-value comparator is delivered to the set input of the flip-flop, and the output signal of the second limit-value comparator is delivered to the reset input of the flip-flop.

In one embodiment, an analog regulator is used in the electric amplifier. In this embodiment, an unclocked flip-flop may be used. If the first limit-value comparator, in the event that the amplitude of the closed-loop control signal is exceeded by an upper amplitude limit value, makes its output signal available to the set input of the flip-flop, then an output of the flip-flop is set. If the voltage amplitude of the closed-loop control signal reaches a lower amplitude limit value, then the second limit-value comparator makes its output signal available to the reset input of the flip-flop.

In one embodiment, the first and second limit-value comparators are two identical comparators. In this embodiment, an inverter is connected between the second limit-value comparator on the output side and the reset input of the flip-flop. The inverter may invert the voltage value of the output signal of the second limit-value comparator in such a way that the output of the flip-flop is reset via the reset input.

In one embodiment, a digital regulator is used in the electric amplifier. In this embodiment, a clocked flip-flop is used in addition to the digital limit-value comparators. The clocked flip-flop, in addition to a clocked input, to which a clock signal is supplied by a clock generating circuit, has a clock activation input. The clock activation input is supplied with a regulator clock by the regulator. In this embodiment, the clock input is activated, and the flip-flop accordingly reacts only to signals at the set and reset inputs, only when a closed-loop control signal has been made available later than the regulator clock.

In one embodiment, malfunctions do not affect the setting and resetting of the flip-flop. Malfunctions may be expressed as, for example, voltage peaks—also called glitches—in the closed-loop control signal. The frequency of the oscillating closed-loop control signal changes the output signals, for example, from a logical "0" to a logical "1. " The change in output signals is because of increased voltage amplitudes at the outputs of the limit-value comparators. The frequency of the oscillating closed-loop control signal corresponds to the frequency of an evaluation signal, which is made available at the output of the flip-flop and is used for frequency monitoring.

In one embodiment, the monitoring device includes a counter circuit. In this embodiment, after the monitoring of the closed-loop control signal amplitude using the comparator circuit, the monitoring device monitors the frequency of an evaluation signal. The counter circuit is supplied with the evaluation signal made available to the flip-flop. In one embodiment, the evaluation signal is equivalent to the oscillating closed-loop control signal, if with rising amplitude the closed-loop control signal oscillates.

In one embodiment, the counter circuit includes two counters, namely a specification counter and a monitoring counter. A reference signal is supplied to a clock input of the specification counter. The specification counter counts the periods of the reference signal. The specification counter is reset, beyond a predetermined number of periods, via a reset input at the specification counter, via a specification comparator, which is connected to the specification counter on the output side. The specification comparator continuously compares the counter state of the specification counter with a predetermined value. If the predetermined value is reached, the specification comparator changes the voltage value of its output signal, for example, from a logical zero ("0") to a logical one ("1"), and resets not only the specification counter but also the monitoring counter via a reset input.

In one embodiment, the monitoring comparator monitors the frequency of the closed-loop control signal, such that the closed-loop control signal is supplied at a clock input of the monitoring counter and the periods of the closed-loop control signal are counted. The counter state is constantly compared with a predetermined monitoring limit value, using a monitoring comparator connected to the monitoring counter on the output side. If the specification counter reaches a set specified limit value as a result of counting of the periods of the reference signal, then the specification comparator resets not only the specification counter but also the monitoring counter via a reset signal delivered to the reset input.

In one embodiment, the monitoring counter begins again, after every reset, to count the periods of the closed-loop control signal. If during an interval between two reset signals of the specification comparator the counter state of the monitoring counter reaches a value that exceeds a predetermined limit value, the monitoring comparator makes the open-loop control signal, which is delivered to the control unit in order to block the end stage on the input side, available.

In one embodiment, the regulator used in the electric amplifier is embodied as a PI or PID controller. In one embodiment, the standard deviation is used as the monitoring signal. Alternatively, the integrated standard deviation or closed-loop control difference may be used.

In one embodiment, a JK flip-flop with a clock activation function is used as a clocked flip-flop, and an RS flip-flop is used an unclocked flip-flop.

BRIEF DESCRIPTIONS OF THE DRAWINGS

DETAILED DESCRIPTION

Elements corresponding to one another are identified by the same reference symbols in all the drawings.

Figure 1:
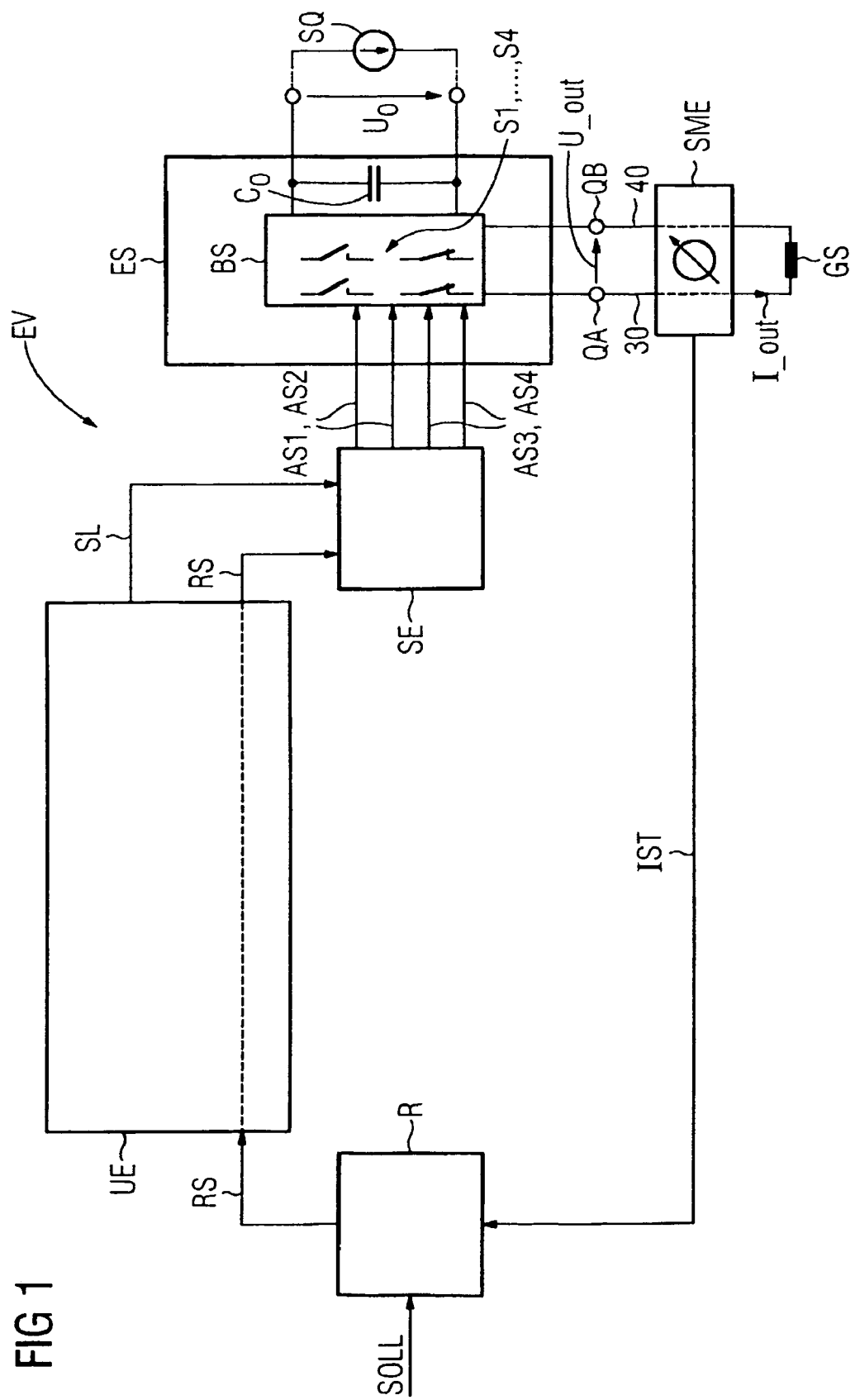
FIG. 1 is a block circuit diagram that shows one embodiment of an electric amplifier, which includes a monitoring device connected between a regulator and a control unit.

In one embodiment, as shown in FIG. 1, an electric amplifier EV includes an end stage ES, which is connected to a voltage source SQ carrying a supply voltage U_0 and which generates an output voltage U_out. The output voltage U_out operates a consumer L, which is shown as a coil GS. The amplifier EV further includes a regulator R, which controls the amplifier EV and makes the output voltage U_out more precise, adjusts a closed-loop control signal RS. The regulator R adjusts the closed-loop control signal RS as a function of a current actual value IST ascertained by a current measuring device SME from the output signal of the end stage ES, by comparison with a current desired value SOLL, and makes the closed-loop control signal RS available to a control unit SE. The control unit SE, using pulse width modulation of the closed-loop control signal RS, generates trigger signals AS1, AS2, AS3, AS4, in order to trigger switch elements S1, S2, S3, S4 of a bridge circuit BS, which is provided in the end stage ES. The bridge circuit BS adjusts the output voltage U_out, to make the circuit elements conducting or blocking.

In one embodiment, the electric amplifier EV includes a monitoring device UE. The closed-loop control signal RS is delivered on the input side of the monitoring device UE for monitoring. The monitoring device UE, as a function of closed-loop control signal RS, may output an open-loop control signal SL to the control unit SE. The monitoring device UE outputs the open-loop control signal SL if the closed-loop control signal RS oscillates with increasing amplitude, for example, from an incorrect setting in the regulator. An unexpected major voltage swing in the closed-loop control signal RS may cause damage to components of the end stage ES. High frequencies of the closed-loop control signal RS may be the cause of an overload of the switch elements S1, S2, S3, S4 or of the capacitor Co from an overly fast switching speed. For example, overly fast switching speeds may take place when voltages and currents are on the order of magnitude of 300 V or 300 A or higher. Overly fast switching speeds occur in the bridge circuit BS of an amplifier EV for loads L, for example, electric motors or magnetic resonance systems.

In one embodiment, the monitoring device UE, which can be achieved with little effort or expense, may be integrated into the control unit SE functioning as a pulse width modulator.

Figure 2:
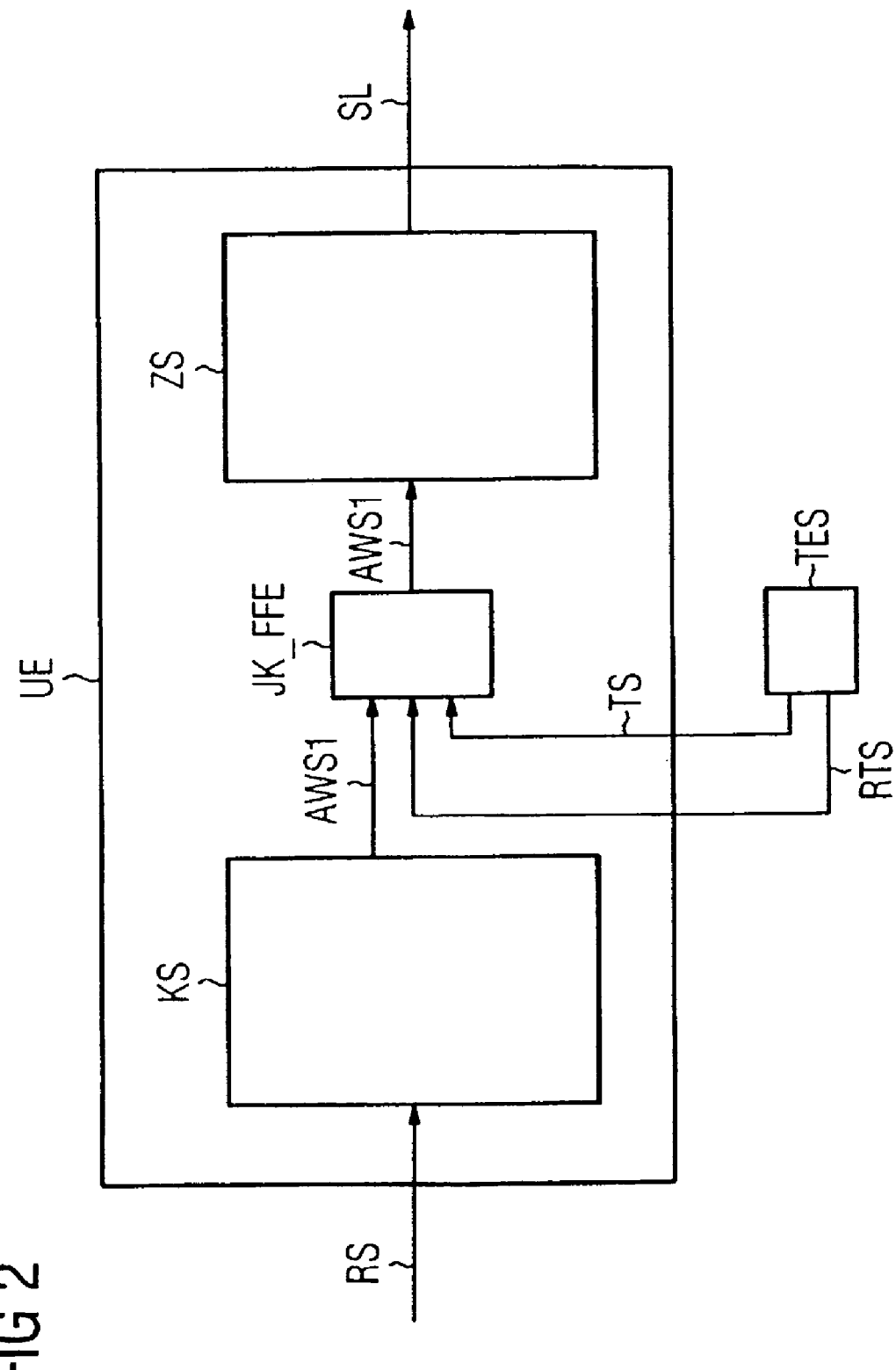
FIG. 2 is a block circuit diagram that shows one embodiment of a monitoring device that includes a comparator circuit, a flip-flop, and a counter circuit.

In one embodiment, as shown in FIG. 2, the monitoring device UE, to which the closed-loop control signal RS is delivered, outputs an open-loop control signal SL as a function of the properties of the closed-loop control signal RS. In one embodiment, the monitoring device UE includes a comparator circuit KS and a counter circuit ZS. The comparator circuit KS and the counter circuit ZS monitor the amplitude and the frequency of the closed-loop control signal RS. The amplitude and frequency are the definitive parameter values for an oscillating signal.

In one embodiment, the monitoring device UE includes a flip-flop FF. A first evaluation signal AWS1 of the comparator circuit KS is delivered to the flip-flop FF, if the voltage amplitude of the closed-loop control signal RS both exceeds an upper amplitude limit value REF_O and undershoots a lower amplitude limit value REF_U.

In one embodiment, a regulator R operates in digital fashion in the electric amplifier EV. For example, the comparators provided in the comparator circuit KS are also in digital form. Accordingly, for further processing the first evaluation signal AWS1, a JK flip-flop JK_FFE, with both a clock input TE_FF and a clock activation input ENA are provided, to which latter input a clock RTS made available to the regulator R is delivered. If the regulator R is digital and the comparators are digital, then a clocked JK flip-flop JK_FFE is expedient in the sense that during further switching operations in the regulator R and in the comparators, unwanted voltage peaks, or glitches, can occur. These glitches are stopped at a clocked flip-flop JK_FF, whenever the clock signal TS at the clock input TE_FF is at logical zero, and thus the flip-flop JK_FF does not react to input signals at the inputs J and K, such as the first evaluation signal AWS1 shown in FIG. 2.

In one embodiment, the monitoring device includes an input for a clock generating circuit TES, which makes a clock signal TS available to the JK flip-flop JK_FFE. TS is a higher-order system clock, from which other clocks, for example, the regulator clock RTS, are derived. The JK flip-flop JK_FFE is connected on the input side to the counter circuit ZS, which monitors the frequency of the closed-loop control signal RS.

In one embodiment, an analog regulator R is provided in the amplifier. The comparators provided in the comparator circuit KS are embodied in analog form, and the flip-flop is embodied as an unclocked RS flip-flop, which is not shown in further detail in the drawing.

Figure 3:
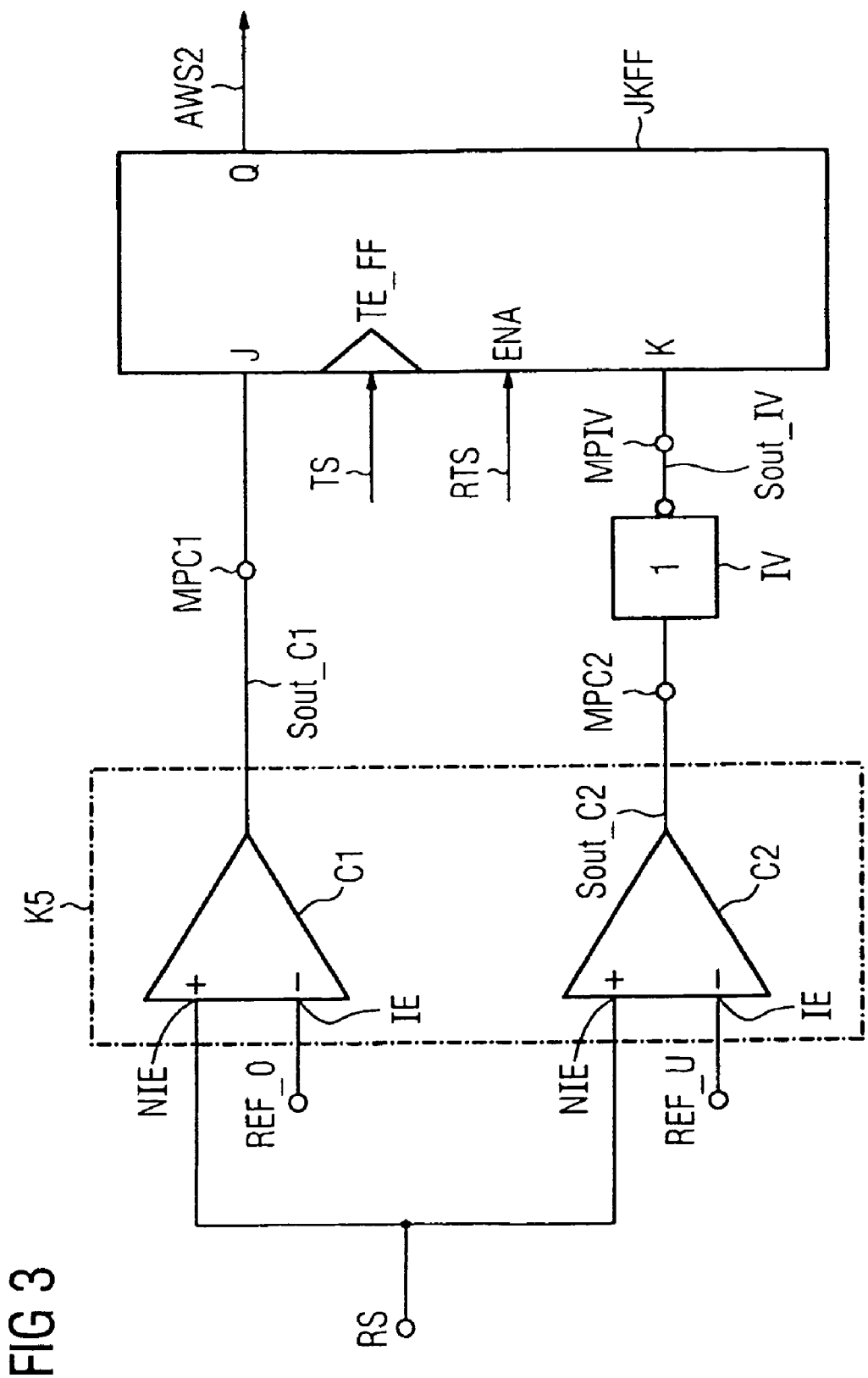
FIG. 3 is a circuit diagram of one embodiment of a comparator circuit and a flip-flop.

In one embodiment, as shown in FIG. 3, the comparator circuit KS and the JK flip-flop JK_FFE for a regulator R operate in digital fashion in the amplifier EV. The comparator circuit KS includes a first limit-value comparator C1 and second limit-value comparator C2. In one embodiment, a closed-loop control signal RS is supplied simultaneously to both limit-value comparators C1, C2 at the noninverting input NIE. The closed-loop control signal RS is compared, by the first limit-value comparator C1, with an upper amplitude limit value REF_O delivered to the inverting input IE of the first limit-value comparator C1. The second limit-value comparator C2, compares the closed-loop control signal RS with a lower amplitude limit value REF_U delivered to the inverting input IE of the second limit-value comparator C2. In one embodiment, both limit-value comparators C1, C2 are digital limit-value comparators, as shown in FIG. 3. In this embodiment, output signals furnish a logical one or a logical zero.

Figure 4:
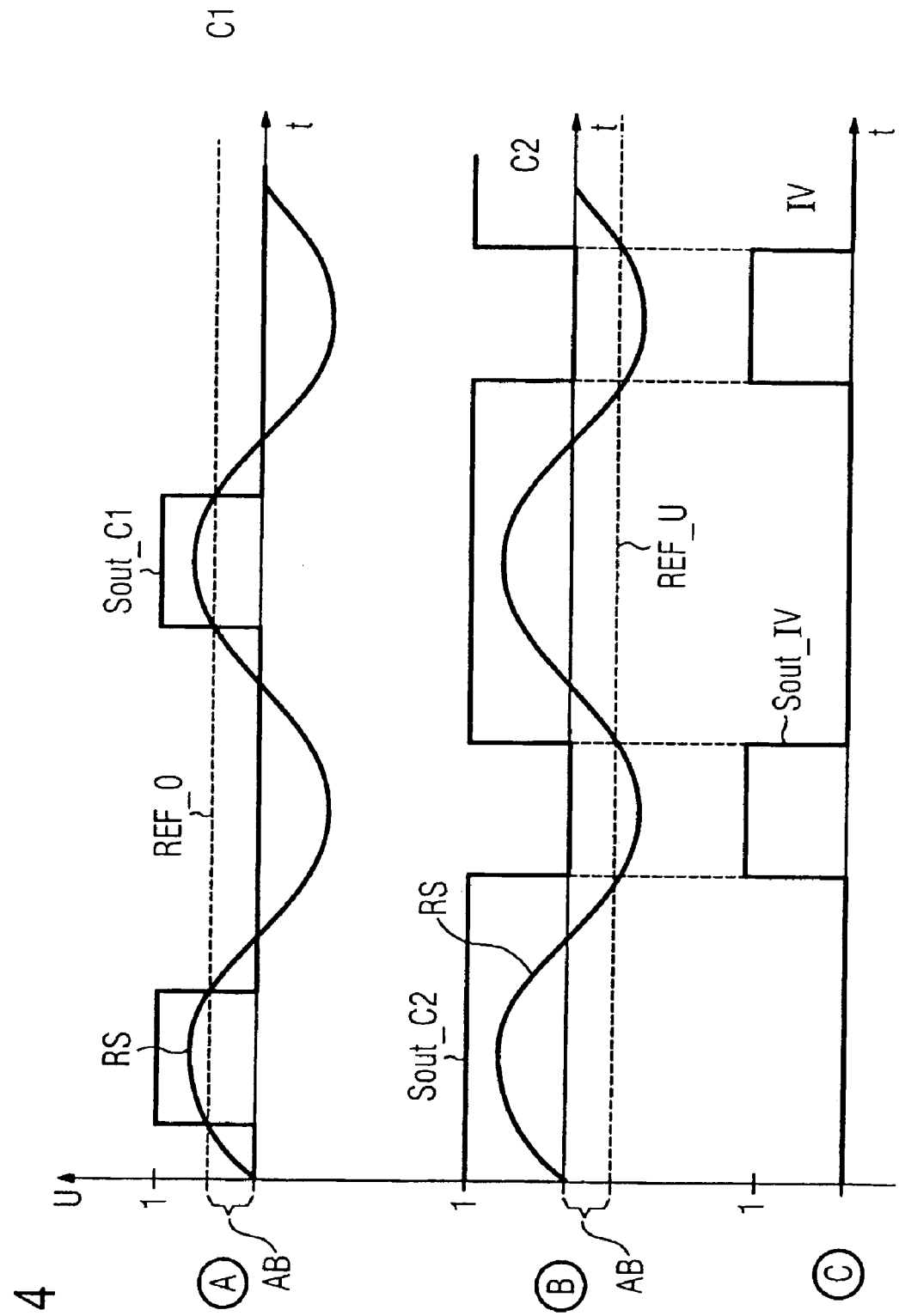
FIG. 4 shows graphs for signal courses of a comparator circuit, at measurement points indicated in FIG. 3.

FIG. 4 shows the voltage signals that may be measured at the outputs of both limit-value comparators C1, C2. Measurement is done toward ground at measurement points MPC1, MPC2, and MPIV, as shown in FIG. 3. MPC1 represents the measurement point at the output of the first limit-value comparator.

Graph A in FIG. 4 shows the course of an output voltage U_out_C1 of the first limit-value comparator C1, together with the course of values of the closed-loop control signal RS over time t. As soon as the amplitude of the closed-loop control signal RS exceeds an upper amplitude limit value REF_O, the first comparator C1 changes its output signal Sout_C1 from a logical zero to a logical one. The first limit-value comparator C1 immediately changes its output signal from a logical one to a logical zero whenever the closed-loop control signal RS undershoots the upper amplitude limit value REF_O.

Graph B in FIG. 4 shows the course of an output voltage U_out_C2 of the second limit-value comparator C2, together with the course of the values of the closed-loop control signal RS over time t. The wiring of the second limit-value comparator C2, is shown in FIG. 3. The closed-loop control signal RS is delivered to the noninverting input NIE of the second limit-value comparator C2, while a lower amplitude limit value REF_U is delivered to the inverting input IE. As long as the closed-loop control signal RS is above the lower amplitude limit value REF_U, the second limit-value comparator C2 makes an output signal Sout_C2 with a logical one available. Only if the closed-loop control signal RS undershoots the lower amplitude limit value REF_U does the second limit-value comparator C2 make an output signal Sout_C2 with a logical zero available. Graph B in FIG. 4 shows the course of the output signal Sout_C2 of the second limit-value comparator C2, together with the course of the closed-loop control signal RS over time t, measured at the measurement point MPC2, which is at the output of the limit-value comparator C2 and is shown in FIG. 3.

In one embodiment, as shown in FIG. 3, the output signals Sout_C1, Sout_C2 of the limit-value comparators C1, C2 are processed by the JK flip-flop JK_FFE. In this embodiment, an evaluation signal for monitoring the frequency of the closed-loop control signal RS is available to the counter circuit ZS, which is connected downstream of the comparator circuit KS, in such a way that a second evaluation signal AWS2 at an output Q of the JK flip-flop JK_FFE corresponds in frequency to that of the closed-loop control signal RS. The amplitude of the closed-loop control signal RS both exceeds the upper amplitude limit value REF_O and undershoots the lower amplitude limit value REF_U. A logical one is tripped at both limit-value comparators C1, C2. If the upper amplitude limit value REF_O is exceeded by the amplitude of the closed-loop control signal RS, the JK flip-flop JK_FFE will output a logical one at its output Q, alternatively, if the lower amplitude limit value REF_U is undershot by the amplitude of the closed-loop control signal RS, the JK flip-flop JK_FFE outputs a logical zero, the output signals Sout_C1 and Sout_C2 are delivered to the inputs J, K of the JK flip-flop JK_FFE.

In another example, if the output signal Sout_C1 of the first limit-value comparator C1, after the amplitude of the closed-loop control signal RS has exceeded the upper amplitude limit value REF_O, has a logical one, the JK flip-flop JK_FFE is set, so that at its output Q it makes a logical one available. If the output signal Sout_C2 of the second limit-value comparator C2, after the amplitude of the closed-loop control signal RS has undershot the lower amplitude limit value REF_U, has a logical zero, this logical zero is then converted into a logical one by an inverter IV. The inverter IV is connected on the output side between the second limit-value comparator C2 and the input K of the JK flip-flop JK_FFE. An output signal Sout_IV, made available at the output of the inverter IV, has a logical one whenever the voltage amplitude of the closed-loop control signal RS undershoots the lower amplitude limit value REF_U—as shown in graph C in comparison to graph B. The output signal Sout_IV is delivered to the input K of the JK flip-flop JK_FFE. The input K of the JK flip-flop JK_FFE, which has a logical one, is reset at the output Q to a logical zero.

In one embodiment, a window comparator is used as an alternative to the two limit-value comparators C1, C2. In this embodiment, the inverter IV may be omitted.

In one embodiment, a comparator with hysteresis is used. In this embodiment, the comparator generates the reference values REF_O and REF_U for itself as a result of the hysteresis. In this embodiment, the flip-flop may also be omitted.

In addition to the inputs J and K of the JK flip-flop JK_FFE, as shown in FIG. 3, the JK flip-flop includes the clock input TE_FF and the clock activation input ENA. The clock signal TS delivered to the JK flip-flop JK_FFE at the clock input TE_FF serves to allow the output of the JK flip-flop JK_FFE to react to signals at the inputs J and K only whenever the clock signal TS has an edge of logical zero after logical one. In this embodiment, the unwanted interference impulses or so-called glitches, for example, caused during switching events in digital circuits, will not bring about any reaction at the output Q of the JK flip-flop JK_FFE and will not make the second output signal AWS2 incorrect in its frequency.

In one embodiment, the clock activation input ENA is supplied with a regulator clock signal RTS. The regulator clock signal RTS activates the clock input TE_FF of the JK flip-flop JK_FFE precisely whenever the closed-loop control signal RS is made available by the regulator R for monitoring. The output Q of the JK flip-flop JK_FFE does not react to signals that may be affected by interference pulses at the inputs J and K when the clock input TE_FF is inactive as a result of the regulator clock signal RTS. For example, the monitoring of the closed-loop control signal RS is done sequentially, being activated and deactivated by the regulator clock signal RTS.

Figure 5:
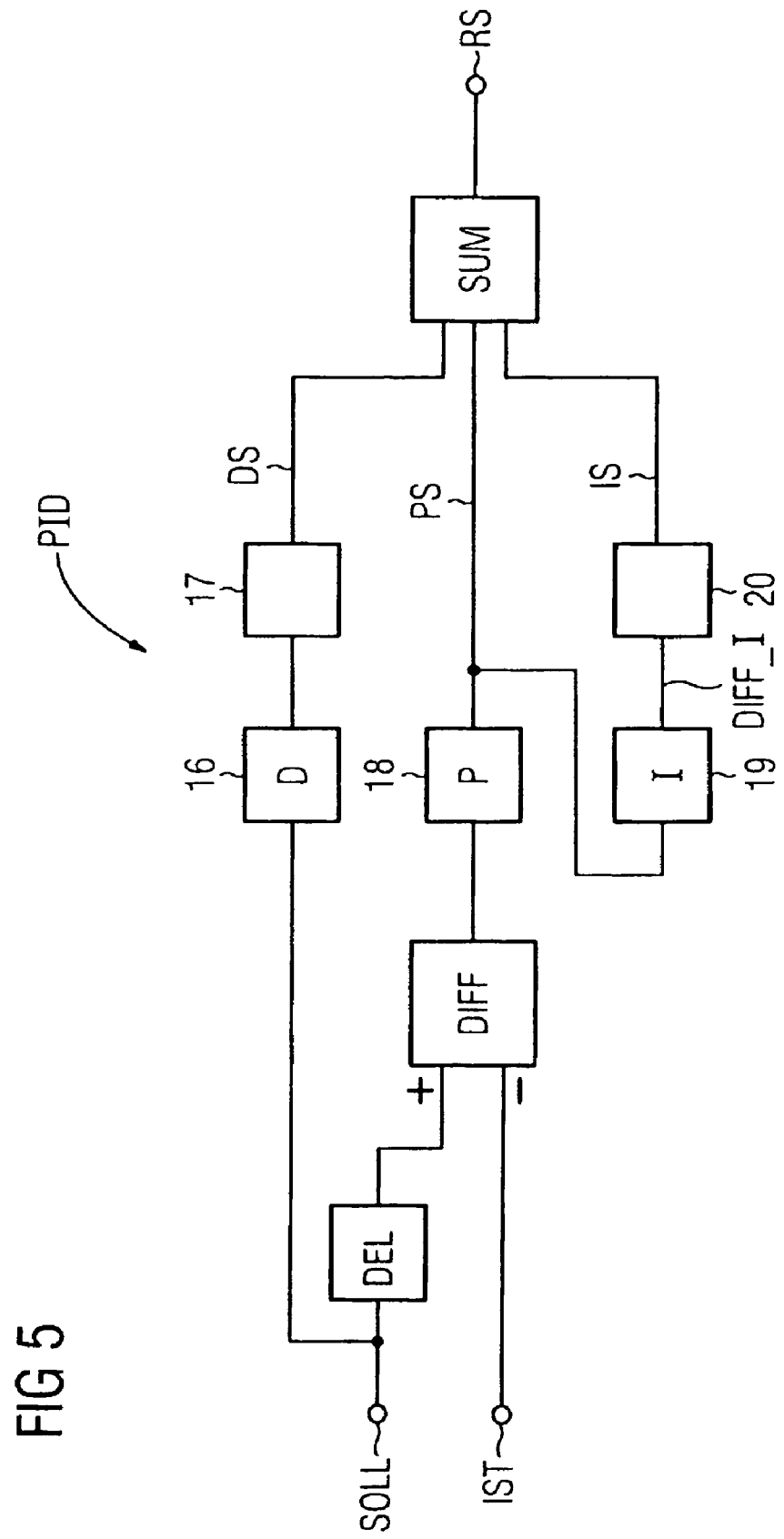
FIG. 5 is a block circuit diagram that shows one embodiment of a regulator of an electric amplifier.

In one embodiment, as shown in FIG. 5, a regulator may be used for the electric amplifier EV. In one embodiment, the regulator PID is a PI regulator PI with a D control component D. The closed-loop control signal RS is generated as a result of the fact that the PID controller generates a closed-loop control difference DIFF from the actual current value IST and a desired current value SOLL that is delayed by a delay DEL. The closed-loop control signal RS corresponds to either the closed-loop control difference DIFF (the amplification equals 1) or to a closed-loop control difference PS that is amplified by the multiplier 18. In the event that the delayed desired current value SOLL is equal to the actual current value IST, the closed-loop control difference DIFF is equal to zero.

In one embodiment, an integrated closed-loop control difference DIFF_I, or a closed-loop control difference IS, which is amplified by the multiplier 20 and integrated by the integrator 19, is also suitable for oscillation monitoring by the monitoring device UE. A DS component, as shown in FIG. 5, corresponds to a D control component amplified by a multiplier 17 and ascertained from the desired current value SOLL by a differentiator 16. The DS component is not suitable for oscillation monitoring, since this DS component is dependent solely on the desired current value SOLL, and has no components that are dependent on the actual current value IST. The closed-loop control signal RS, which is generally delivered to the control unit SE, is generated by the adder SUM from the DS component, the amplified closed-loop control difference PS, and the amplified, integrated closed-loop control difference IS. In an alternate embodiment, a PI regulator may be used.

In one embodiment, the comparator circuit KS, as shown in FIGS. 2 and 3, has a specified upper and lower amplitude limit value REF_O, REF_U, each at the same spacing AB (FIG. 4) from the zero voltage line. In this embodiment, a signal that carries no useful component is suitable for oscillation monitoring by the monitoring device UE. In one embodiment, the useful component of the closed-loop control signal RS is determined predominantly by the amplified, integrated closed-loop control difference IS, the closed-loop control difference DIFF, or its amplification PS. The useful component of the closed-loop control signal RS is well suited for oscillation monitoring. Alternatively, the closed-loop control signal RS may be freed of any possibly interference with the useful component by a high-pass filter upstream of the comparators C1 and C2.

Figure 6:
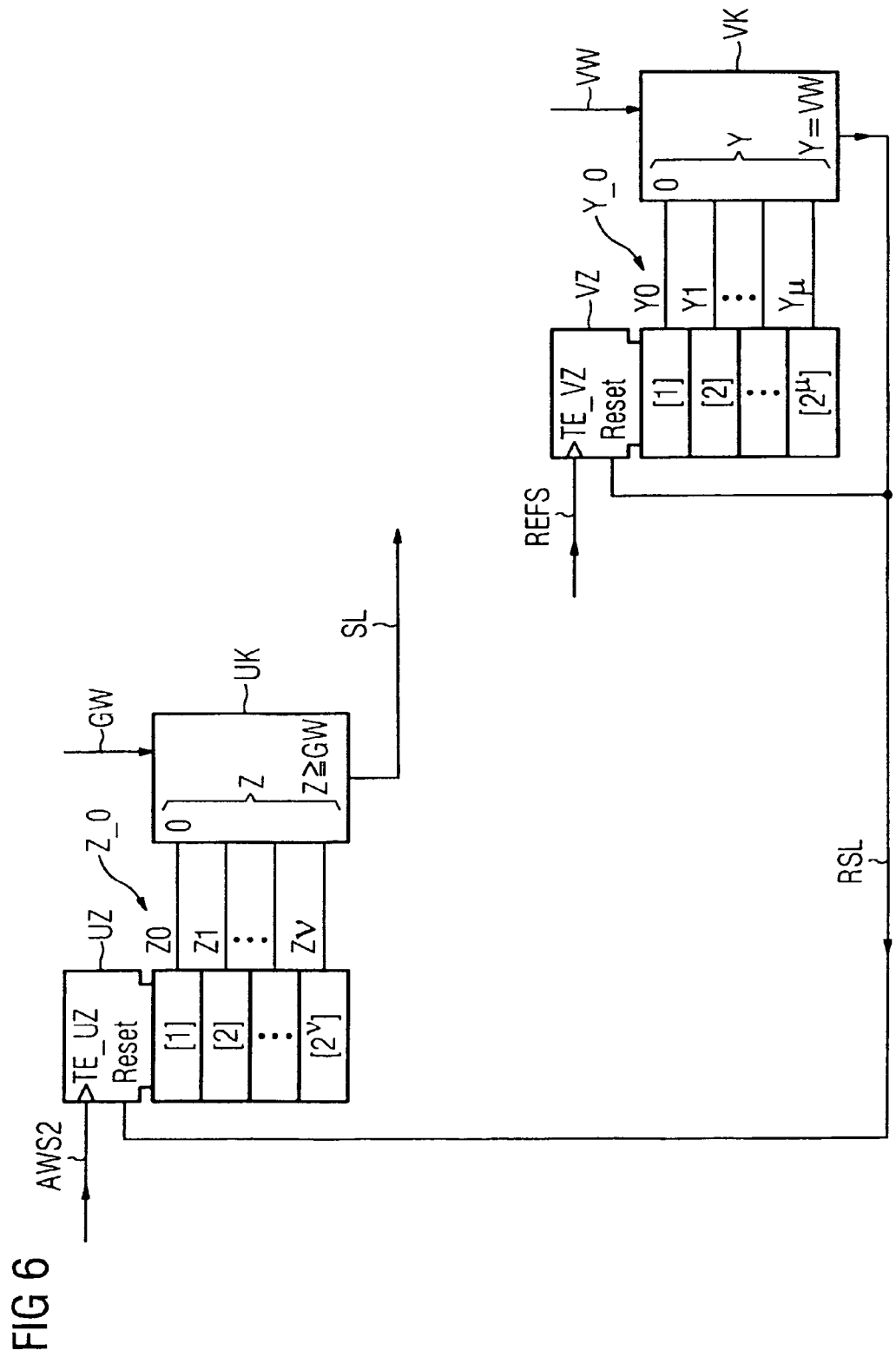
FIG. 6 is a circuit diagram of one embodiment of a counter circuit, which includes a specification counter and a monitoring counter.

In one embodiment, as shown in FIG. 6, the counter circuit ZS includes a specification counter VZ and a monitoring counter UZ. The second evaluation signal AWS2 is made available to the monitoring counter UZ by the flip-flop FF and delivered to a clock input TE_UZ of the monitoring counter UZ. The second evaluation signal AWS2 has a frequency that corresponds to the frequency of the closed-loop control signal RS.

To monitor the frequency of the closed-loop control signal RS, a reference signal REFS is supplied to a clock input TE_VZ of the specification counter VZ. The specification counter VZ, by counting periods of the reference signal REFS, increases a counter state Y_0. A specification comparator VK, connected on the output side to the specification counter VZ, immediately after each counting step of specification counter VZ, compares the counter state Y_0 of the specification counter VZ with a predetermined specified limit value VW. When the value of the counter state Y_0 reaches the specified limit value VW, the specification comparator VK makes a reset signal RSL available to both the specification counter VZ and the monitoring counter UZ. The reset signal is delivered to the reset input of both the specification counter VZ and the monitoring counter UZ. The specification counter VZ and the monitoring counter UZ, which counts periods of the second evaluation signal AWS2 delivered to the clock input TE_UZ, are reset.

In one embodiment, the reference signal REFS has a frequency of, for example, 10 kHz, and the comparison value VW is "10000." In this embodiment, the specification counter is reset at the counter state Y_0 with the value "10000". For example, for a reference signal REFS at 10 kHz, this is done automatically after one second. Simultaneously with the specification counter VZ, the monitoring counter UZ is also reset, regardless of its counter state Z_0, and after each resetting, it begins anew to count the periods of the second evaluation signal AWS2.

In one embodiment, the second evaluation signal AWS2 corresponds to the closed-loop control signal RS upon oscillation of the closed-loop control signal RS with increasing amplitude. In one embodiment, a monitoring comparator UK is connected on the output side to the monitoring counter UZ, for monitoring the counter state Z_0. The monitoring comparator UK is used to monitor the second evaluation signal AWS2. If the counter state Z_0 of the monitoring counter UZ reaches a predetermined monitoring limit value GW, then the monitoring comparator UK outputs an open-loop control signal SL, which is delivered to the control unit SE, shown in FIG. 1, for triggering the end stage ES of the amplifier EV.

In one embodiment, if the closed-loop control signal RS, for example, has a frequency of 2 kHz, and the monitoring limit value GW of "5000" is specified to the monitoring comparator UK, then the counter state Z_0 of the monitoring counter UZ at the aforementioned reference signal of 10 kHz and the specified limit value VW of "10000", does not reach the monitoring limit value GW of "5000." In this embodiment, the monitoring counter UZ was reset beforehand by the reset signal RSL of the specification comparator VK. This is true because, in the above exemplary embodiment, the resetting of both the monitoring counter UZ and the specification counter VZ takes place after precisely one second. After precisely one second, the monitoring counter UZ, with the second evaluation signal AWS2 of 2 kHz, has reached a counter state Z_0 with a value of only "2000", but not with a value of "5000," which corresponds to the monitoring limit value GW.

In one embodiment, if the frequency of the second evaluation signal AWS2 is 20 kHz, for example, then in precisely one second, until the resetting of the monitoring counter UZ caused by the specification comparator VK, the counter state Z_0 would have a value of "20000". In this embodiment, since the monitoring limit value GW is "5000," the monitoring comparator UK, at a second evaluation signal AWS2 having the frequency of 20 kHz, on reaching the value "5000," as a result of the counter state Z_0, outputs the open-loop control signal SL to the control unit SE.

In one embodiment, the control unit SE stores the occurrence of the open-loop control signal SL in memory. At the open-loop control signal SL the end stage ES assumes a switching state, as described in conjunction with FIG. 7 or FIG. 8, until as a result of a further open-loop control signal the amplifier is to resume operation.

Figure 7:
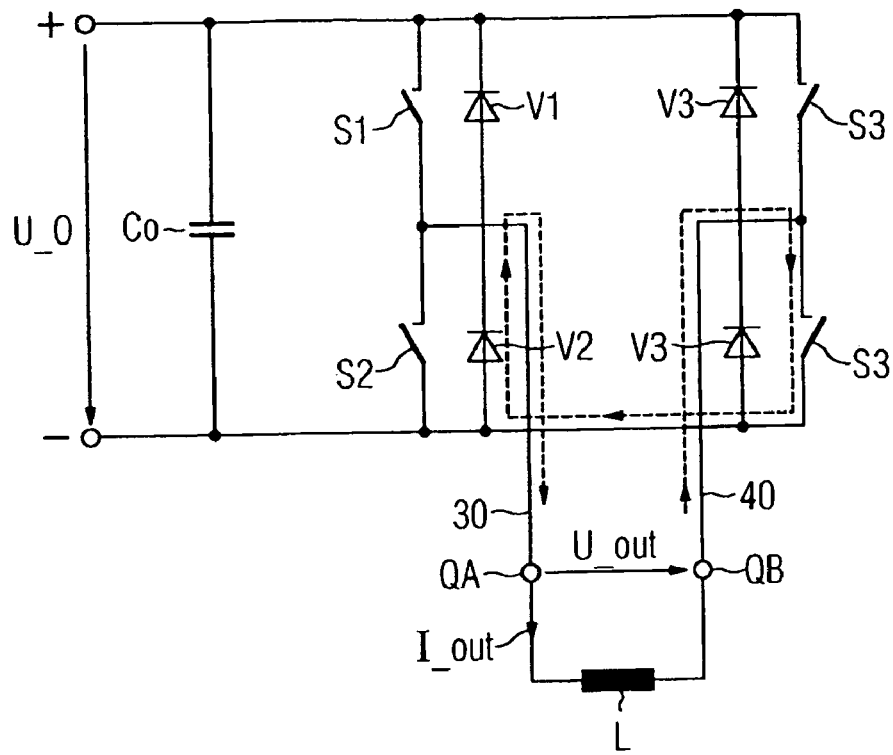
FIGS. 7, 8 are circuit diagrams of one embodiment of an end stage of the electric amplifier.
Figure 8:
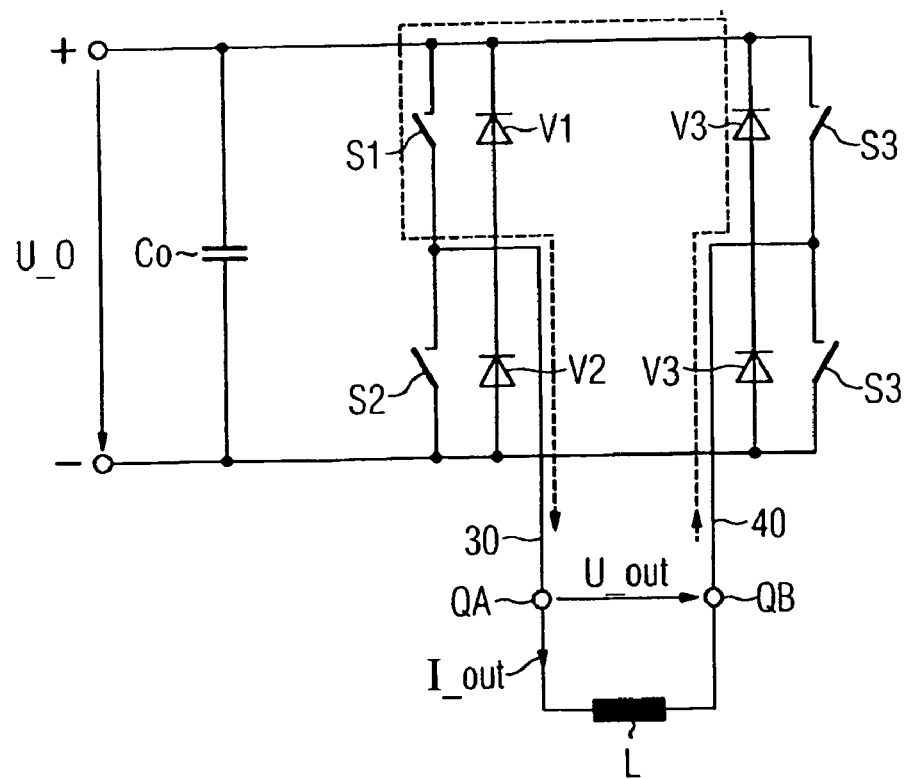

In one embodiment, as shown in FIGS. 7 and 8, the end stage ES includes a bridge circuit BS. As shown in FIGS. 7 and 8, the construction of the bridge circuit BS provided in the end stage ES is shown in the form of a substitute circuit diagram. Two different switching states of the switch elements S1, S2, S3 and S4 provided in the bridge circuit BS are shown in FIGS. 7 and 8, in the event of an open-loop control signal SL delivered to the control unit SE by the monitoring device UE. The bridge circuit BS, at which a potential-free supply voltage U_0 is present, includes an H bridge with four switch elements S1, S2, S3 and S4. The four switch elements S1, S2, S3 and S4 each respond to a respective pulse width modulated trigger signal AS1, AS2, AS3 and AS4 of the control unit SE that functions as a pulse width modulator.

In one embodiment, the switch elements S1, S2, S3 and S4 are embodied as, for example, MOS-FET transistors, or as bipolar transistors with free-wheel diodes. The switch elements, S1 and S3, and S2 and S4, are connected to the positive and negative terminals, respectively, of the supply voltage U_0. The remaining terminals of each two switch elements (S1 and S3, and S2 and S4,) disposed in a bridge branch, are connected in pairs to one another and each pair is connected to a respective connecting line 30, 40.

In one embodiment, the connecting line 30 leads to an output QA of the end stage ES. The connecting line 40 leads to an output QB of the end stage ES. One free-wheel diode V1, V2, V3 and V4 each is connected antiparallel to the respective switch elements S1, S2, S3 and S4. In one embodiment, the capacitor Co is used for buffering the potential-free supply voltage U_0. In this embodiment, an intermediate-circuit voltage is applied to the bridge circuit BS. The outputs QA, QB of the end stage ES are connected to a substantially inductive consumer L, for example, a gradient coil GS.

In one embodiment, as shown in FIG. 7, the switch elements S2 and S4 are switched on, or in other words are closed. As shown in FIG. 7, the current in the end stage ES flows from the output QB via the switch element S4 and the free-wheel diode V2 to the output QA of the end stage ES. In one embodiment, the switch element S2 includes a MOS-FET transistor. In this embodiment, the MOS-FET can take on a portion of the diode current of the free-wheel diode V2. The output QB of the end stage ES is then minimally positive compared to the output QA. The switching state of the end stage ES shown in FIG. 7 is called the "lower free-wheeling operating mode".

This "lower free-wheeling operating mode" is a first alternative upon triggering of the control unit SE with the open-loop control signal SL for blocking the end stage ES. In the "lower free-wheeling operating mode", the output current I_OUT of the end stage ES fades less steeply, which is of particular significance for some consumers L, for example, a magnetic resonance system.

FIG. 8 shows an alternative to the "lower free-wheeling operating mode". In one embodiment, the switch elements S1 and S3 are switched on, or in other words are closed. The current flows in the end stage ES from the output QB via the free-wheel diode V3 and the switch element S1 to the output QA of the end stage ES. In one embodiment, the switch element S3 includes a MOS-FET transistor. In this embodiment, the MOS-FET can take on some of the diode current of the free-wheel diode V3. The switching state of the end stage ES shown in FIG. 8 is known as the "upper free-wheeling operating mode".

In one embodiment, in the free-wheeling operating mode, the end stage is blocked only on the input side, because a current flowing in the load at the instant of the blocking on the input side is not undone by a high reverse voltage.

In one embodiment, all the switch elements S1, S2, S3 and S4 may be blocked (not shown). In this embodiment, a magnetic resonance system with all of the switch elements blocked may lead to stimulation of the patient.

In one embodiment, the closed-loop control circuit may also be blocked, for example, by providing that the closed-loop control signal RS is switched to a value, which results in an output voltage U out of zero at the output of the end stage ES, as a result of which the regulator is switched off.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method for controlling an electric amplifier, the method comprising:
    monitoring an amplitude value of a closed-loop control signal of a regulator using a comparator circuit;
    monitoring a period length value of the closed-loop control signal of the regulator using a counter circuit;
    adjusting the closed-loop control signal as a function of an output signal of an end stage of the electric amplifier;
    comparing the amplitude value of the closed-loop control signal to a reference signal amplitude limit value;
    comparing the period length value of the closed-loop control signal to a reference signal period length limit value;
    triggering the end stage when the amplitude limit value and the period length limit value are exceeded or undershot by the amplitude value and period length value, respectively, of the closed-loop control signal; and
    blocking an input side and/or the regulator when the end stage is triggered.

2. The method as defined by claim 1, in which the comparator circuit makes a first evaluation signal available to a flip-flop when the amplitude value of the closed-loop control signal exceeds an upper amplitude limit value, or when the amplitude value of the closed-loop control signal falls below a lower amplitude limit value.

3. The method as defined by claim 2, comprising:
    generating an upper limit value in a second evaluation signal, which is made available to the flip-flop, if the amplitude value exceeds the upper amplitude limit value, and
    generating a lower limit value in a second evaluation signal, if the amplitude value undershoots the lower amplitude limit value.

4. The method as defined by claim 3, comprising:
    providing the second evaluation signal, which originates in a digital closed-loop control signal, by the flip-flop whenever the flip-flop is activated by a clocking signal of the regulator.

5. The method as defined by claim 3, comprising:
    generating an open-loop control signal that triggers the end stage, if the duration of the period length value of the closed-loop control signal is less than the duration of the period length limit value of the reference signal;
    wherein when the first evaluation signal has been generated agrees with the second evaluation signal.

6. The method as defined by claim 5, comprising:
    monitoring a closed-loop control signal frequency of the closed-loop control signal that is reciprocal to the period length value, with a reference signal frequency of the reference signal, which frequency is reciprocal to the period length limit value; and
    generating the open-loop control signal if a monitoring limit value, formed by adding together periods of the reference signal within an adjustable time interval, is exceeded by a specified limit value formed by adding together periods of the closed-loop control signal within the time interval.

7. The method as defined by claim 6, comprising:
    comparing a differential closed-loop control signal, which is a closed loop control of the closed-loop control signal, with the reference signal.

8. The method as defined by claim 7, comprising:
    forming an integrated differential closed-loop control signal by integration from the differential closed-loop control signal; and
    comparing the integrated differential closed-loop control signal with the reference signal.

9. An electric amplifier, comprising:
    an end stage;
    a regulator that precedes the end stage; and
    a monitoring device that is operative to monitor a closed-loop control signal made available by the regulator, the monitoring device comprising a counter circuit that monitors the frequency of the closed-loop control signal and a comparator circuit that monitors an amplitude of the closed-loop control signal,
    wherein the monitoring device is connected between the regulator and a control unit that is connected to the end stage on an input side.

10. The electric amplifier as defined by claim 9, wherein the counter circuit is connected on the input side to the comparator circuit via a flip-flop.

11. The electric amplifier as defined by claim 10, wherein the comparator circuit has a first limit-value comparator, connected on the input side to the regulator and on the output side to an input of the flip-flop, and wherein the first limit-value comparator is operative to compare the amplitude of the closed-loop control signal with an upper amplitude limit value.

12. The electric amplifier as defined by claim 11, wherein the comparator circuit has a second limit-value comparator, connected on the input side to the regulator and on the output side to a further input of the flip-flop, and wherein the second limit-value comparator is operative to compare the amplitude of the closed-loop control signal with a lower amplitude limit value.

13. The electric amplifier as defined by claim 12, wherein the second limit-value comparator is connected on the output side, via an inverter, to the further input of the flip-flop.

14. The electric amplifier as defined by claim 13, wherein the counter circuit includes a monitoring counter, which on the input side has a clock input connected to the flip-flop and a reset input connected to a specification comparator, and which is connected on the output side to the control unit via a monitoring comparator.

15. The electric amplifier as defined by claim 14,
wherein the counter circuit has a specification counter, which has a reference input for a reference signal and a reset input for a reset signal that is made available by the specification comparator connected to the specification counter on the output side.

16. The electric amplifier as defined by claim 10, comprising:
an integrated digital regulator,
wherein the flip-flop has a clock activation input, which is connected to a clock generating circuit that makes a regulator clock available.

17. The electric amplifier as defined by claim 10,
wherein the flip-flop includes a JK flip-flop.

18. The electric amplifier as defined by claim 10, comprising and integrated analog regulator, wherein the flip-flop includes an unclocked flip-flop.

19. The electric amplifier as defined by claim 9,
wherein the regulator is operative to make a differential closed-loop control signal available, and wherein the differential closed-loop control signal is delivered to the monitoring device.

* * * * *